US006725109B2

(12) United States Patent
Hile et al.

(10) Patent No.: US 6,725,109 B2
(45) Date of Patent: Apr. 20, 2004

(54) SOUND GENERATOR CIRCUIT SYSTEM AND METHOD

(75) Inventors: Wayne B. Hile, Round Lake Park, IL (US); James B. Henrie, Grays Lake, IL (US)

(73) Assignee: Palm, Inc., Santa Clara, CA (US)

( * ) Notice: Subject to any disclaimer, the term of this patent is extended or adjusted under 35 U.S.C. 154(b) by 571 days.

(21) Appl. No.: 09/803,824

(22) Filed: Mar. 12, 2001

(65) Prior Publication Data

US 2002/0126857 A1 Sep. 12, 2002

(51) Int. Cl.[7] .......................... G06F 17/00; H04R 3/00; H03F 3/38; H03F 3/217

(52) U.S. Cl. ......................... 700/94; 381/111; 381/116; 381/117; 330/207 A; 330/251; 330/10

(58) Field of Search ................................ 381/111, 116, 381/117; 330/251, 207 A, 10; 700/94

(56) References Cited

U.S. PATENT DOCUMENTS 5,592,559 A * 1/1997 Takahashi et al. .......... 381/111
5,994,973 A * 11/1999 Toki .......................... 332/109
6,028,943 A * 2/2000 Nagata ...................... 381/111
6,321,129 B1 * 11/2001 D'Agosto, III .............. 700/94
6,388,514 B1 * 5/2002 King et al. .................. 330/10
6,557,072 B2 * 4/2003 Osborn ...................... 711/106
6,563,376 B2 * 5/2003 Fujisawa .................... 330/10

OTHER PUBLICATIONS

DragonBall™ MC68EZ328 Application Notes, © 1996 Motorola, Inc., 7 pps.

* cited by examiner

*Primary Examiner*—Minsun Oh Harvey
*Assistant Examiner*—Laura A. Grier
(74) *Attorney, Agent, or Firm*—Foley & Lardner LLP

(57) ABSTRACT

A sound generator circuit configured for a handheld computer is disclosed. A method of producing a tone with a sound generator and handheld computer is also disclosed. The sound generator circuit includes a low pass filter having an input and an output. The input is coupled to a pulse width modulated (PWM) signal line. The sound generator circuit also includes a switching circuit coupled to the output of the low pass filter and being controlled by the output of the low pass filter. Further, the sound generator circuit includes a sound generator having a first and a second terminal. Further still, the sound generator circuit can include a high-pass filter coupled across the first and second terminals.

20 Claims, 16 Drawing Sheets

M100 low volume setting, 3kHZ
(1) PWM input, (2) Signal at sound generator

M100 med volume setting, 3kHZ
(1) PWM input, (2) Signal at sound generator

M100 high volume setting, 3kHZ
(1) PWM input, (2) Signal at sound generator

M100 low volume setting, 6kHZ
(1) PWM input, (2) Signal at sound generator

M100 med volume setting, 6kHZ
(1) PWM input, (2) Signal at sound generator

M100 high volume setting, 6kHZ
(1) PWM input, (2) Signal at sound generator

M500/M505 low volume setting, 3kHZ
(1) PWM input, (2) Signal at sound generator

M500/M505 med volume setting, 3kHZ
(1) PWM input, (2) Signal at sound generator

M500/M505 high volume setting, 3kHZ
(1) PWM input, (2) Signal at sound generator

M500/M505 low volume setting, 6kHZ
(1) PWM input, (2) Signal at sound generator

M500/M505 med volume setting, 6kHZ
(1) PWM input, (2) Signal at sound generator

M500/M505 high volume setting, 6kHZ
(1) PWM input, (2) Signal at sound generator

SOUND GENERATOR CIRCUIT SYSTEM AND METHOD

FIELD OF THE INVENTION

The invention relates to sound generators typically used in computing devices. In particular, the invention relates to a compact sound generator circuit for a personal digital assistant. Yet further still, the invention relates to a circuit configured to improve the sound quality of a simple sound generator for a handheld computer.

BACKGROUND OF THE INVENTION

Handheld computing devices, "palmtops", "palmhelds", personal digital assistants (PDAs), or handheld computers typically weigh less than a pound and fit in a pocket. These handhelds generally provide some combination of personal information management, database functions, word processing, and spreadsheets. Because of the small size and portability of handhelds, strict adherence to hardware constraints, such as sound generation hardware, must be maintained. It is conventional to use a sound generator in a handheld device which is configured to operate ideally at a particular single frequency, rather than across a broad audio frequency range. When the sound generator is used across the audio frequency range, it provides "poor sound quality" with a widely varying sound pressure level (SPL) over the audio frequency range for the same user setting.

Other conventional implementations of sound generation circuits include a dynamic speaker that is designed to operate across an audio frequency range having a substantially flat frequency response across the range. Such dynamic speakers are physically larger and cost many times more than sound generators. Further, the dynamic speaker drive circuit is also more complicated and expensive to implement than a simple sound generator.

Further, as depicted in FIG. 4 an audio system 5 of the prior art includes a resistor and capacitor (RC) circuit 10 and is used with a pulse width modulated (PWM) signal source 20, a fourth order low pass filter 30, and an audio amplifier 40 to provide audio signals to a speaker 50. Low pass filter 30 typically causes substantial attenuation of the filtered PWM signal from source 20. Accordingly, audio amplifier 40 is required to provide suitable amplification for the audio signal. Thus, because of the complexity of a fourth-order low pass filter, and the requirement for an amplifier, a substantial expense is associated with the circuit components of system 5 and substantial space requirements are necessary for housing the circuit components of system 5 within a handheld computer. Also, the amplifier requires additional power which may not be available in a handheld device. Further, system 5 requires utilizing a reconstruction rate of the PWM output of 32 kHz. Such rapid sampling, along with associated table look-ups and calculations, requires additional processing power and speed which may be unavailable on a handheld device.

Accordingly, there is a need for a compact sound generator circuit that utilizes simple circuitry to improve sound quality over an audible frequency range. Further, there is a need for a sound generator circuit that is used to provide improved sound quality using a compact sound generator and utilizing a PWM signal.

The teachings herein below extend to those embodiments which fall within the scope of the appended claims, regardless of whether they accomplish one or more of the above mentioned needs.

SUMMARY OF THE INVENTION

An exemplary embodiment relates to a sound generator circuit configured for a handheld computer. The sound generator circuit includes a low pass filter having an input and an output. The input is coupled to a pulse width modulated (PWM) signal line. The sound generator circuit also includes a switching circuit coupled to the output of the low pass filter and being controlled by the output of the low pass filter. Further, the sound generator circuit includes a sound generator having a first and a second terminal, the first terminal being coupled to a voltage source and the second terminal being coupled to a switching circuit. Furtherstill, the sound generator circuit includes a high pass filter coupled across the first and second terminals.

Another exemplary embodiment relates to a handheld computer. The handheld computer includes a processor, a memory coupled to the processor, and a sound generator circuit configured to receive a pulse width modulated (PWM) signal from the processor. The sound generator circuit includes a low pass filter having an input and an output. The input is configured to receive the PWM signal. The sound generator circuit also includes a switching circuit coupled to the output of the low pass filter and being controlled by the output of the low pass filter. The sound generator circuit further includes a sound generator having a high pass filter coupled to and in parallel therewith.

Further, an exemplary embodiment relates to a method of producing a tone with a sound generator in a handheld computer. The method includes filtering a pulse width modulated (PWM) signal with a low pass filter to provide a slope to the edges of the PWM signal. The method also includes causing a switching circuit to open and close according to the filtered signal. Further, the method includes filtering the signal using a capacitor disposed across the terminals of a sound generator.

BRIEF DESCRIPTION OF THE DRAWINGS

The invention will become more fully understood from the following detailed description, taken in conjunction with the accompanying drawings, wherein like reference numerals refer to like elements, in which.

DETAILED DESCRIPTION OF THE PREFERRED EMBODIMENTS

Figure 1:
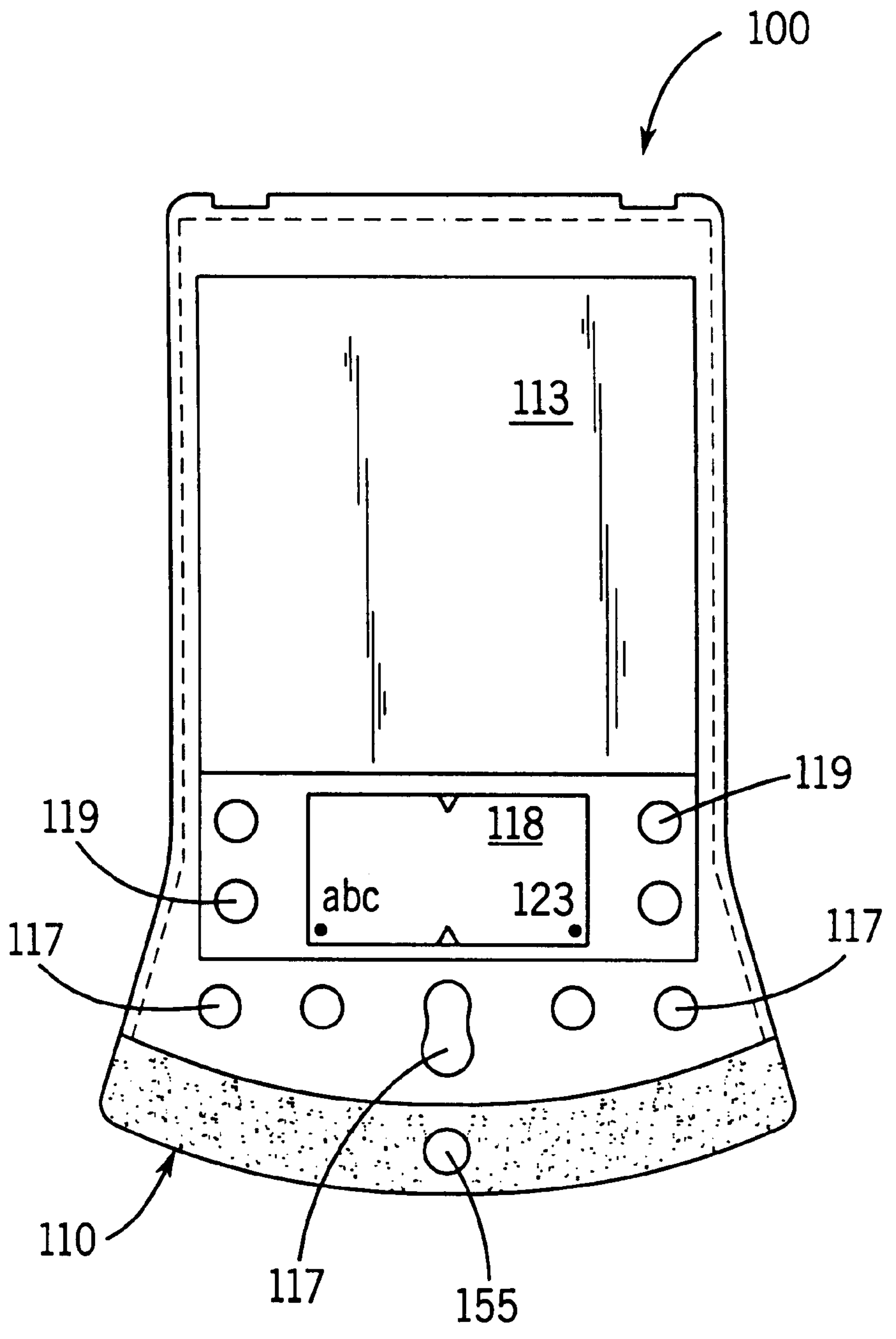
FIG. 1 is a schematic top planar view of a handheld computer.

Referring to FIG. 1, a handheld computer 100 is depicted, being optionally detachably coupled to an accessory device 110 according to an exemplary embodiment. Handheld computer 100 may include Palm style computers such as, but not limited to, Palm Pilot™, Palm III™, Palm IIIc™, Palm VTM, Palm VII™, and Palm M100™ organizers, manufactured by Palm, Inc., of Santa Clara, Calif. Other exemplary embodiments may include Windows CETM handheld computers, or other handheld computers and personal digital assistants, as well as cellular telephones, and other mobile computing devices. Further, handheld computer 100 may be configured with or without accessory device 110 or optionally with any of a variety of other accessory devices.

Preferably, handheld computer 100 includes interactive hardware and software that performs functions such as maintaining calendars, phone lists, task lists, notepads, calculation applications, spreadsheets, games, and other applications capable of running on a computing device. Handheld computer 100, depicted in FIG. 1 includes a plurality of input functions, keys 117 and a display 113 having graphical user interface features. Display 113 may be provided with an interface that allows a user to select and alter displayed content using a pointer, such as, but not limited to, a stylus. In an exemplary embodiment, display 113 also includes a Graffiti™ writing section 118, or other handwriting recognition software, for tracing alphanumeric characters as input. A plurality of input buttons 119 for performing automated or preprogrammed functions may be provided on a portion of display 113. In a particular embodiment, display 113 is a touch screen display that is electronically responsive to movements of a stylus on the surface of display 113.

Accessory device 110 may be one of several types of accessories, such as, but not limited to, a modem device for serial and/or wireless data communications, a wireless telephony device, a Universal Serial Bus (USB) device, or a communication cradle having an extended housing. Accessory device 110 may include one or more ports for parallel and/or serial data transfer with other computers or data networks. Handheld computer 100 may use accessory device 110 for the purpose of downloading and uploading software and for synchronizing data on handheld computer 100 with a personal computer, for example. Accessory device 110 may couple to handheld computer 100 through an electrical connector. Button 155 on accessory 110 may effectuate an electrical connection between accessory device 110 and handheld computer 100 when the two are connected.

Figure 2:
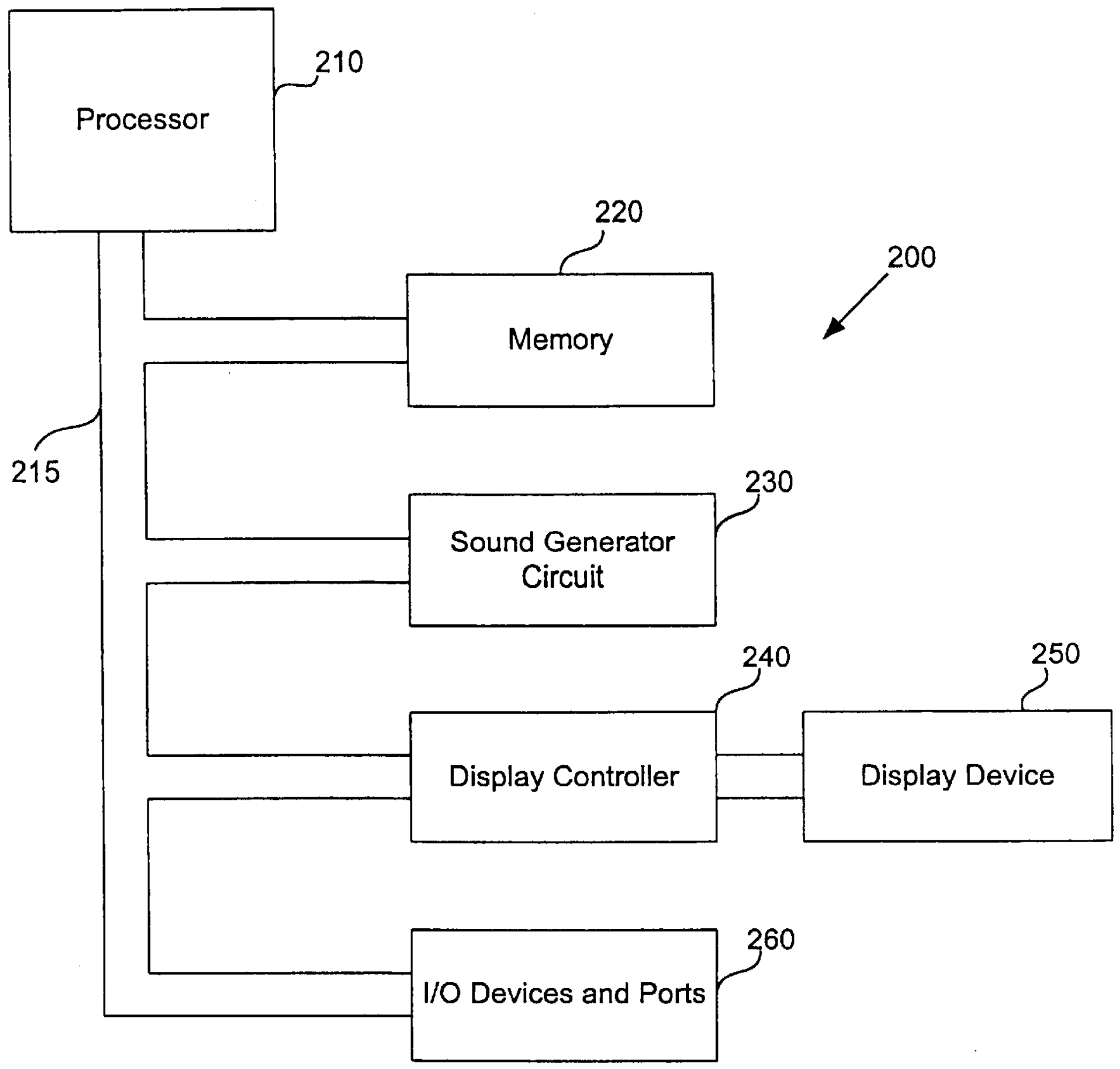
FIG. 2 is an exemplary general block diagram of a communications bus architecture for a handheld computer including a sound generator circuit.

Referring to FIG. 2, an exemplary block diagram of a communications bus architecture 200 for a handheld computer, such as, but not limited to handheld computer 100, is depicted. Communications bus architecture 200 includes a processor 210 coupled to a communications bus 215. A memory 220, a sound generator circuit 230, a display controller 240, and various input/output (I/O) devices and ports 260 are all coupled to communications bus 215. Further, a display device 250 is coupled to display controller 240 which is coupled to communications bus 215. Processor 210 is configured to run programs stored in memory 220 and to selectively provide sound, as required, through a sound generator circuit 230. Further, display device 250 is configured to display information as necessary according to the program running on processor 210 and instructions from display controller 240. Input/output devices and ports 260 are used to provide communication and access to any of a number of and/or a variety of input/output devices, such as, but not limited to, printers, network connections, storage devices, other handheld computers, wireless devices, cellular devices, modems, and the like. Sound generator circuit 230 may be any of a variety of sound generating circuits including, but not limited to buzzers, and other sound generating devices such as speaker-based devices and the like.

Figure 3:
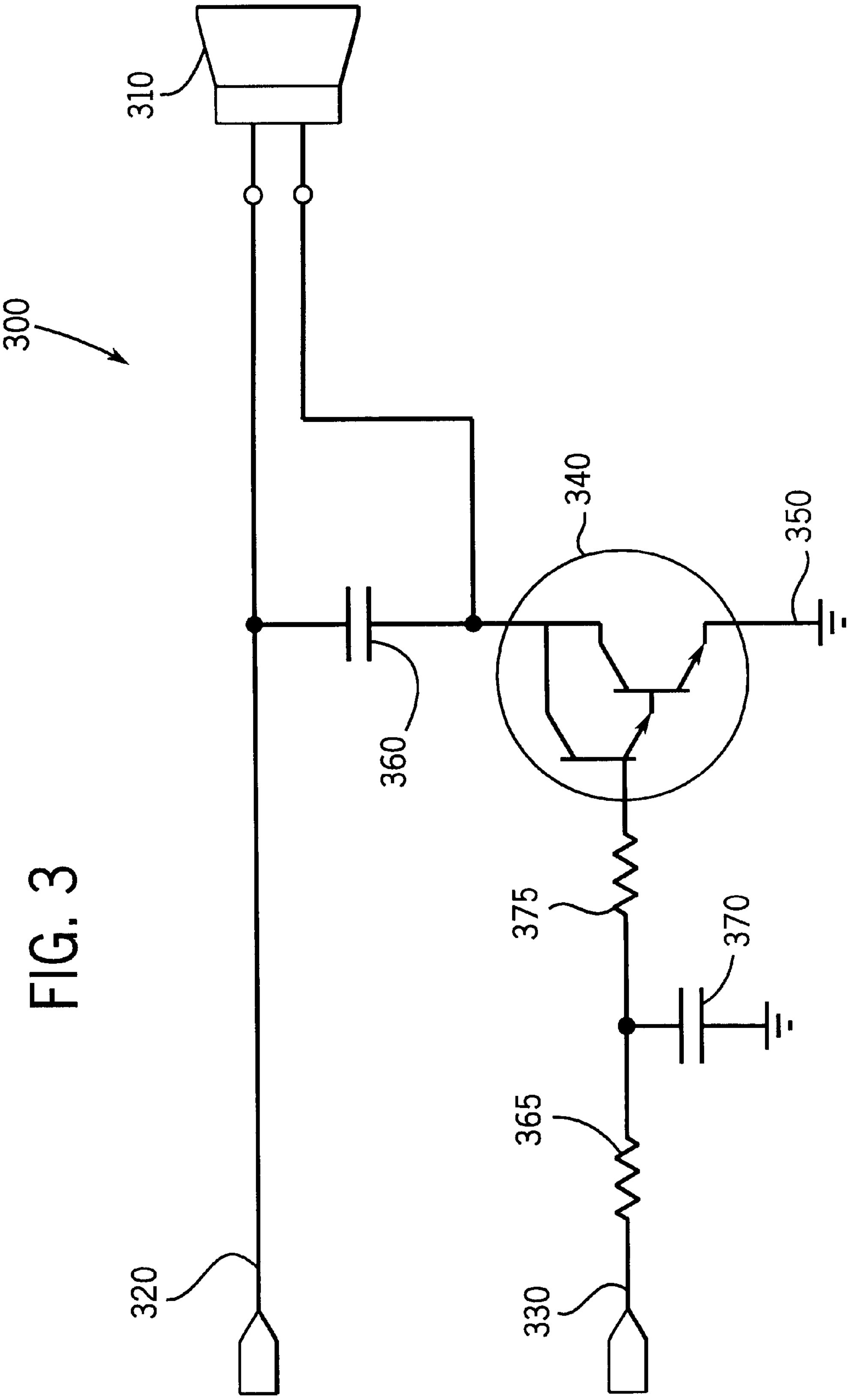
FIG. 3 is an exemplary schematic circuit diagram of the sound generator circuit illustrated in FIG. 2.

Referring now to FIG. 3, an exemplary sound generator circuit 300 is depicted. Sound generator circuit 300 includes a buzzer 310, such as, but not limited to a Bujeon BCT-03SR buzzer available from Bujeon Components Company, Limited of Ansan City, Gyunggi-do, Korea, a Citisound CHB-03F available from Citizen Electronics Company, Limited of Kamikurechi Fujiyoshida-shi Yamanashi-ken, Japan, or any of a variety of other buzzer or sound generation devices. Sound generator circuit 300 includes a battery high input 320 for providing a voltage input to buzzer 310 and a pulse width modulated current (PWM) input 330 receiving a modulated input from a PWM as controlled by a processor, such as, but not limited to a DragonBall™ processor, available from Motorola, Inc. of Austin, Tex. or any of a variety of other processor or processing devices (in an exemplary embodiment the PWM circuit may be incorporated into the processor). Circuit 300 also includes a transistor (or other switching circuit), shown as darlington transistor 340 (e.g., a BST50 transistor available from Philips Semiconductors of Eindhoven, The Netherlands), providing switching to buzzer 310 according to the PWM signal received. Transistor 340 is configured to alternately drive the current through buzzer 310 or to short buzzer 310 to ground 350. Circuit 300 also includes a capacitor 360 (e.g., one (1) microfarad ($\mu$F)) for filtering out low frequency signals and a resistor 365 (e.g., 4.7 kiloOhms (KΩ)) and capacitor 370 (e.g., 0.01 $\mu$F) combination for filtering out high frequency signals and for preventing potential back electromotive forces (EMF) from buzzer 310 damaging transistor 340. Further still, circuit 300 includes a current limiting resistor 375 (e.g., 10 KΩ) configured to limit high current signals received from the PWM. Circuit 300 is exemplary of any of a variety of sound generation circuits and is not included to limit the scope of the claims but has been included to show one possible implementation thereof.

In circuit 300, the PWM signal received by PWM input 330 is shaped prior to driving transistor 340 by a relatively simple, relatively low cost low pass filter, including resistor 365 and capacitor 370, preferably designed with a roll off frequency near the design frequency of the sound generator. The low pass filter produces a gradual slope to the edges of each pulse of the signal, while still allowing the frequency range that is desired, to be achieved (see FIGS. 12–17). Further, capacitor 360 has been provided across the sound generator terminals and acts to round the corners of the signal, providing a curve as the signal transitions (see FIGS. 12–17). As an additional benefit, capacitor 360 aids in the control of back electromagnetic force (EMF) that is generated when buzzer 310 returns to an undriven state. Control of back EMF from buzzer 310 helps to protect transistor 340 from being damaged.

Figure 5:
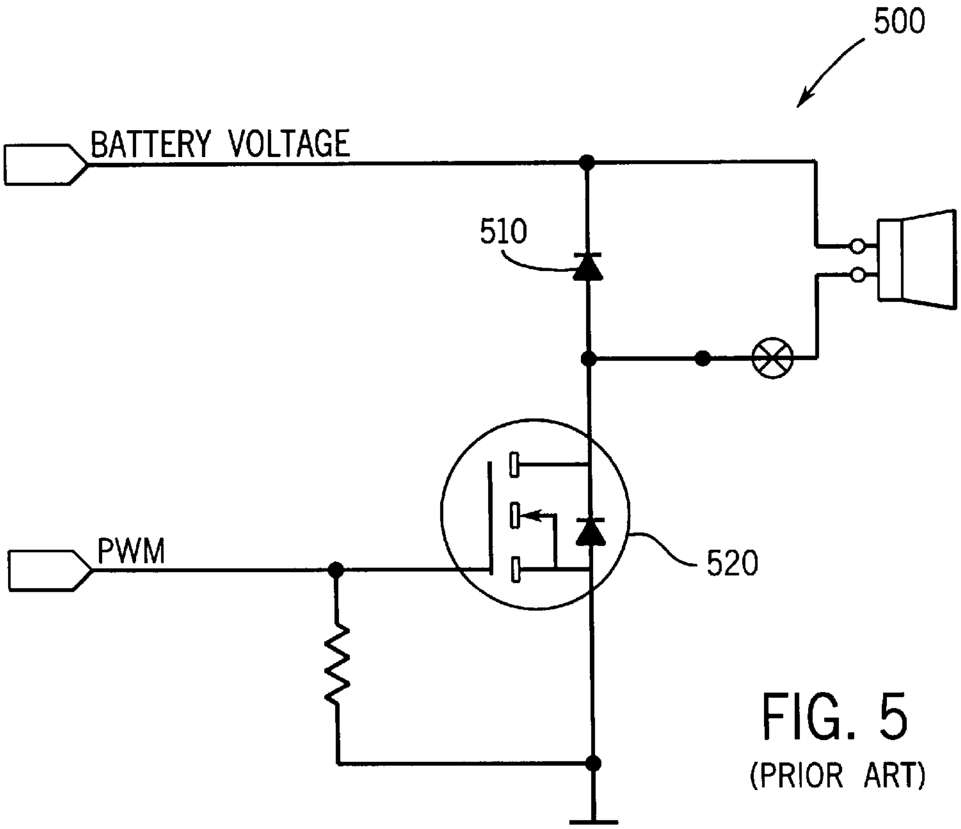
FIG. 5 (PRIOR ART)
FIG. 5 is a schematic circuit diagram of another embodiment of a sound generator circuit of the prior art.
Figure 4:
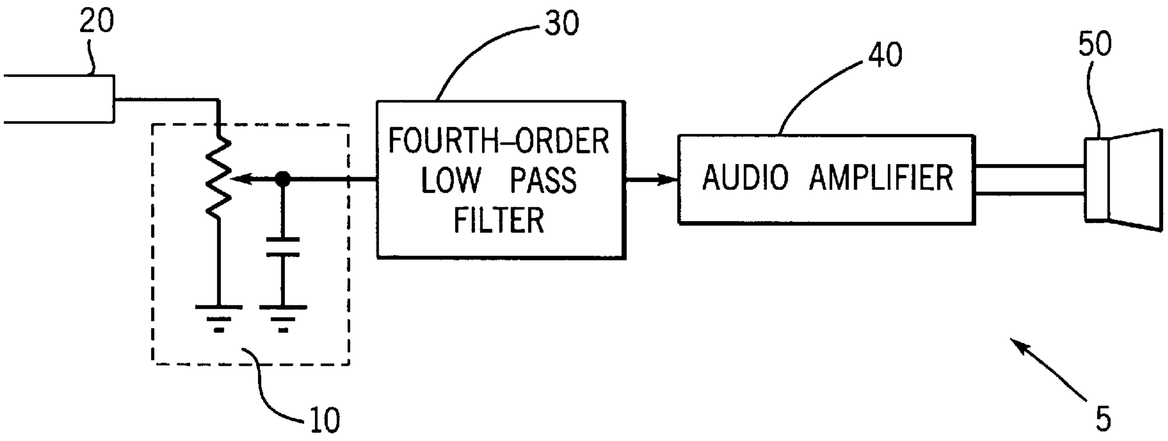
FIG. 4 is a general block diagram of an audio system of the prior art.
Figure 6:
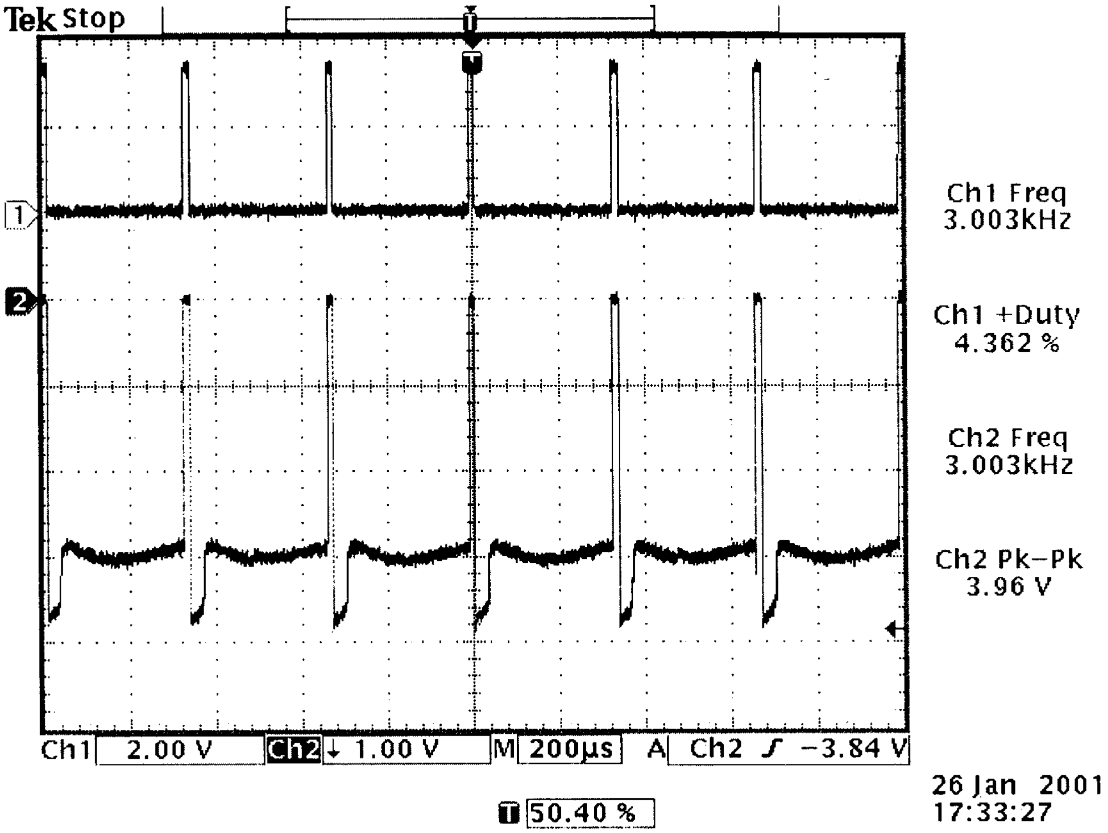
FIGS. 6–11 are exemplary signal response curves providing the response of the signal supplied to a speaker of the circuit of FIG. 5 provided with a PWM input signal.
Figure 7:
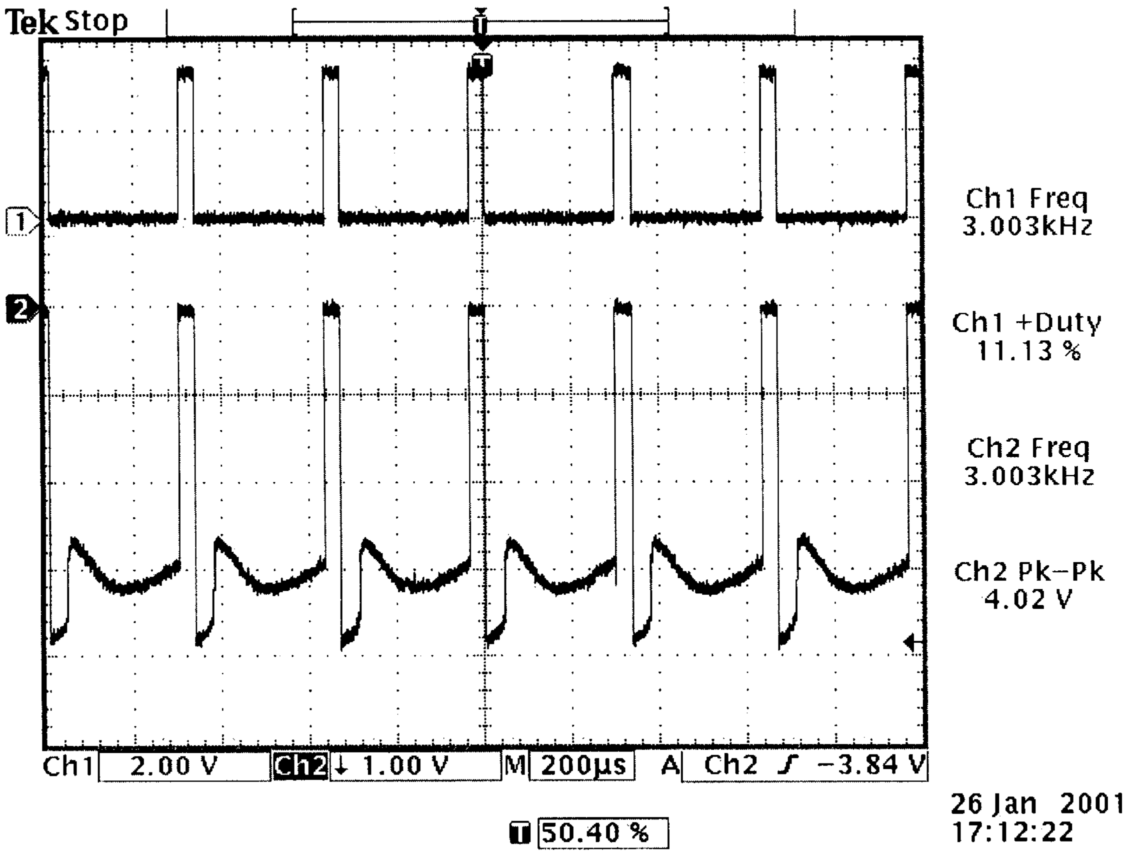
Figure 8:
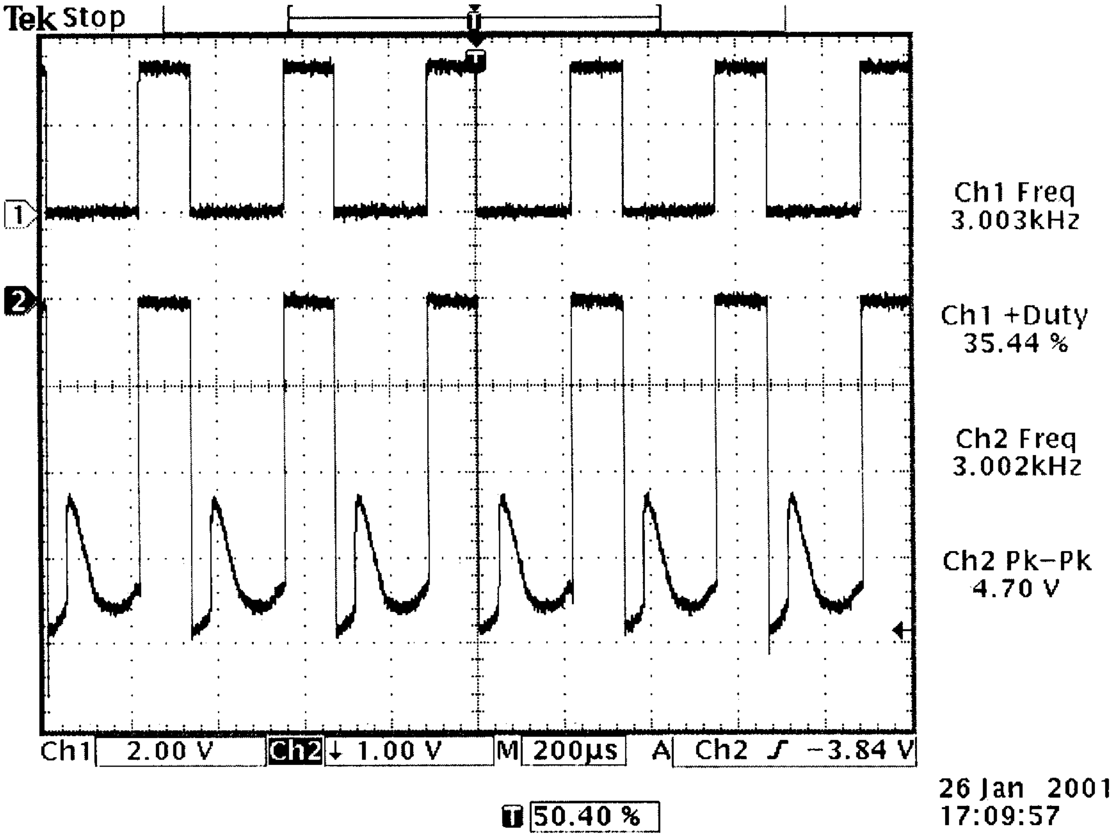
Figure 9:
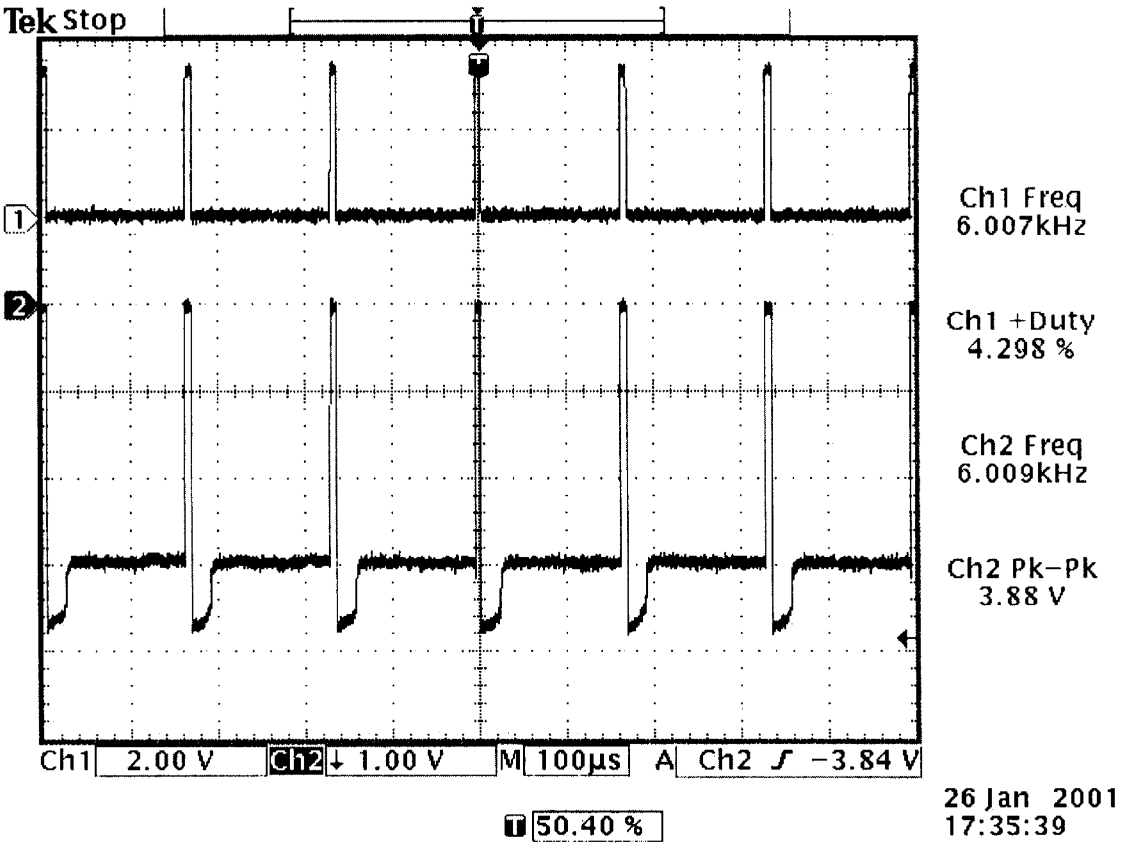
Figure 10:
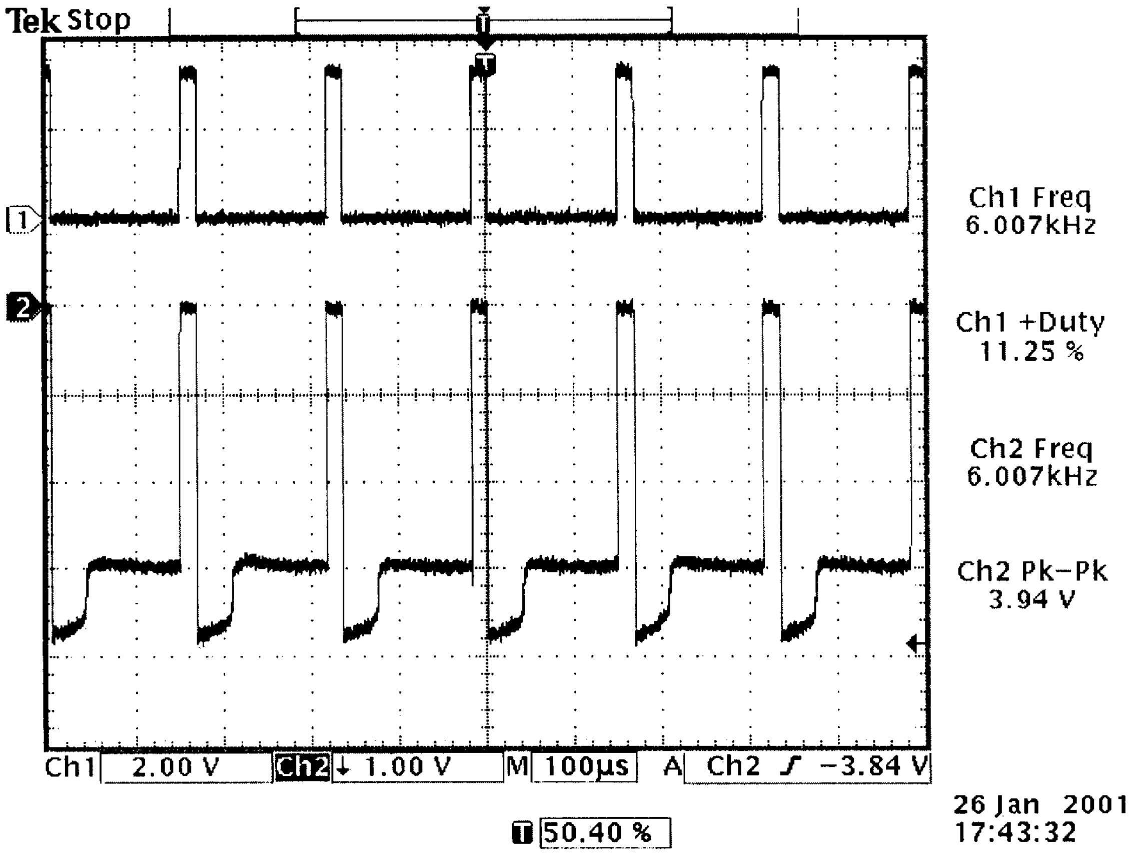
Figure 11:
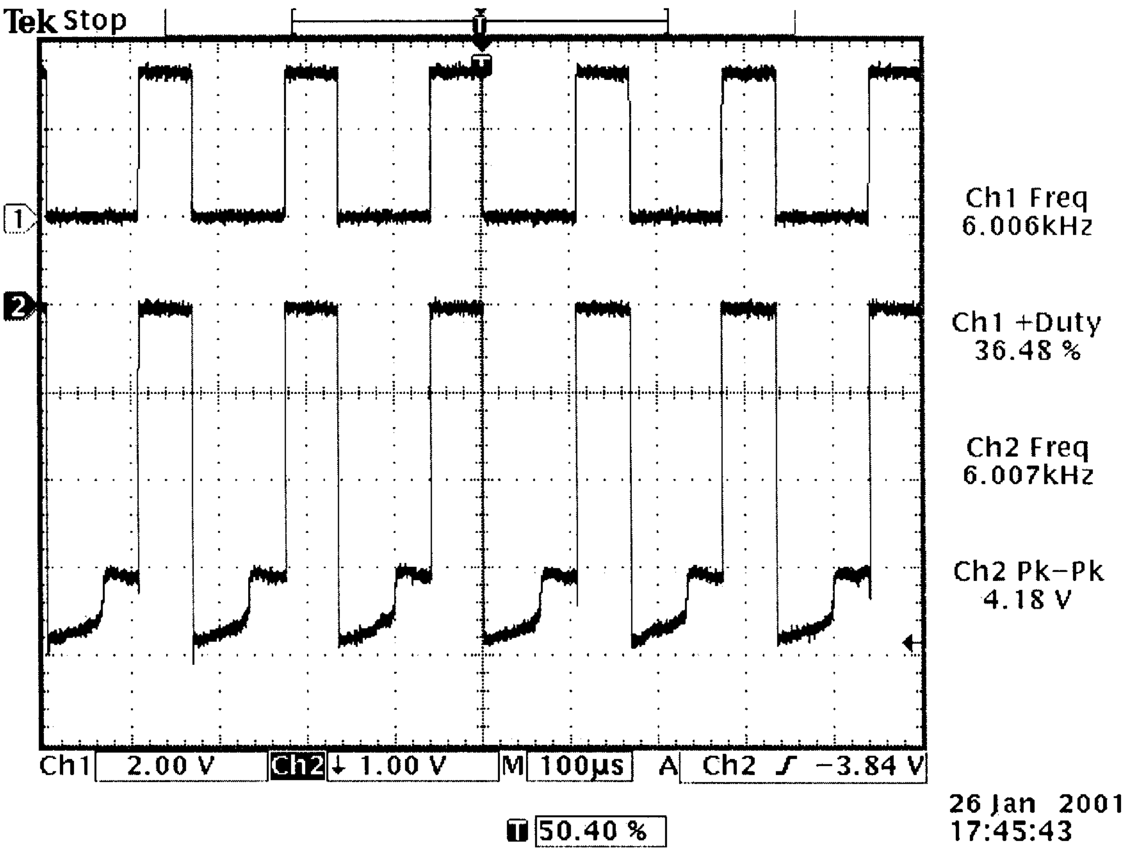
Figure 12:
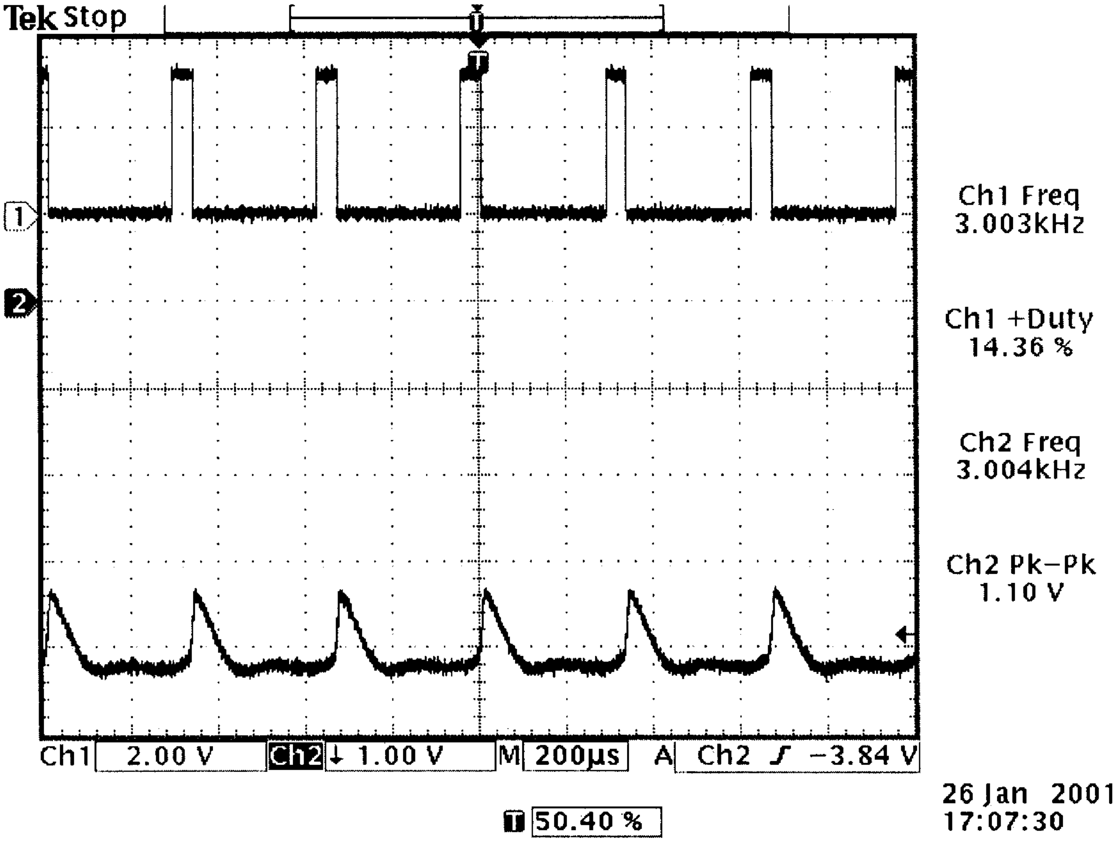
FIGS. 12–17 are exemplary signal response curves of the signal provided to a sound generator of the circuit of FIG. 3 when provided with a PWM input signal.
Figure 13:
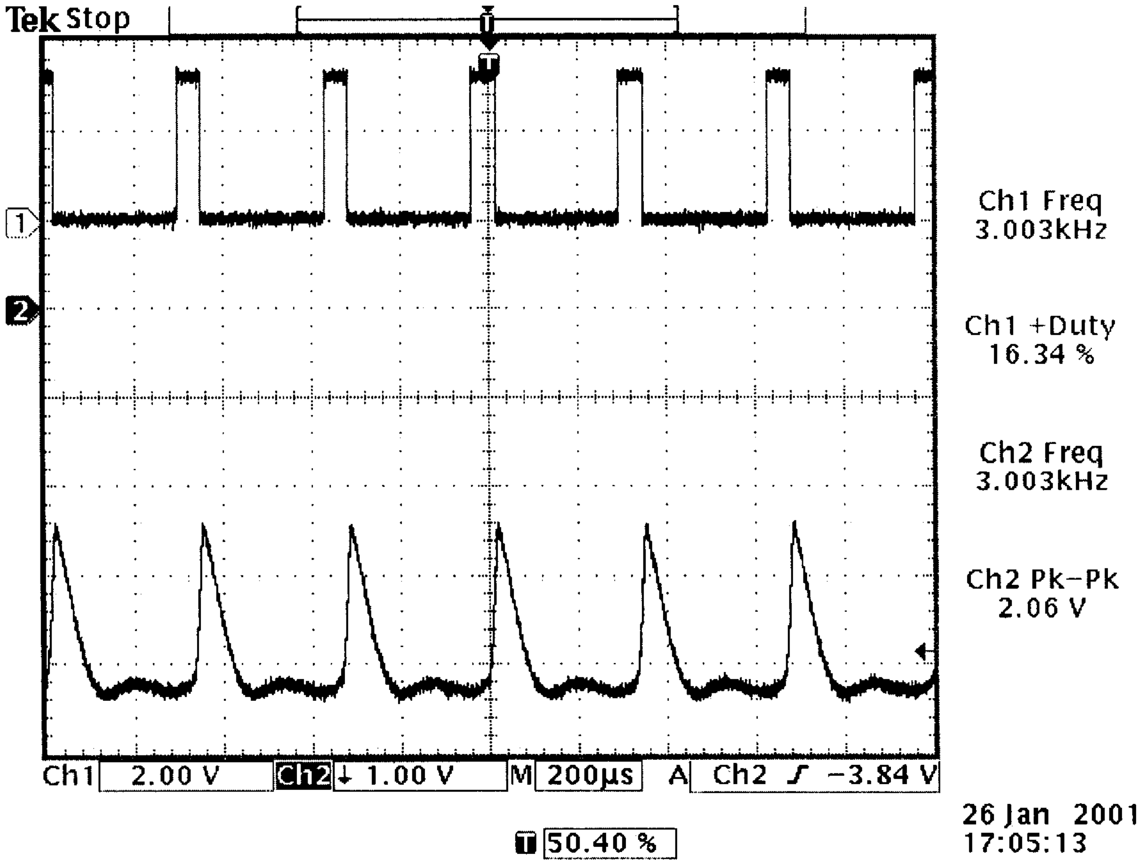
Figure 14:
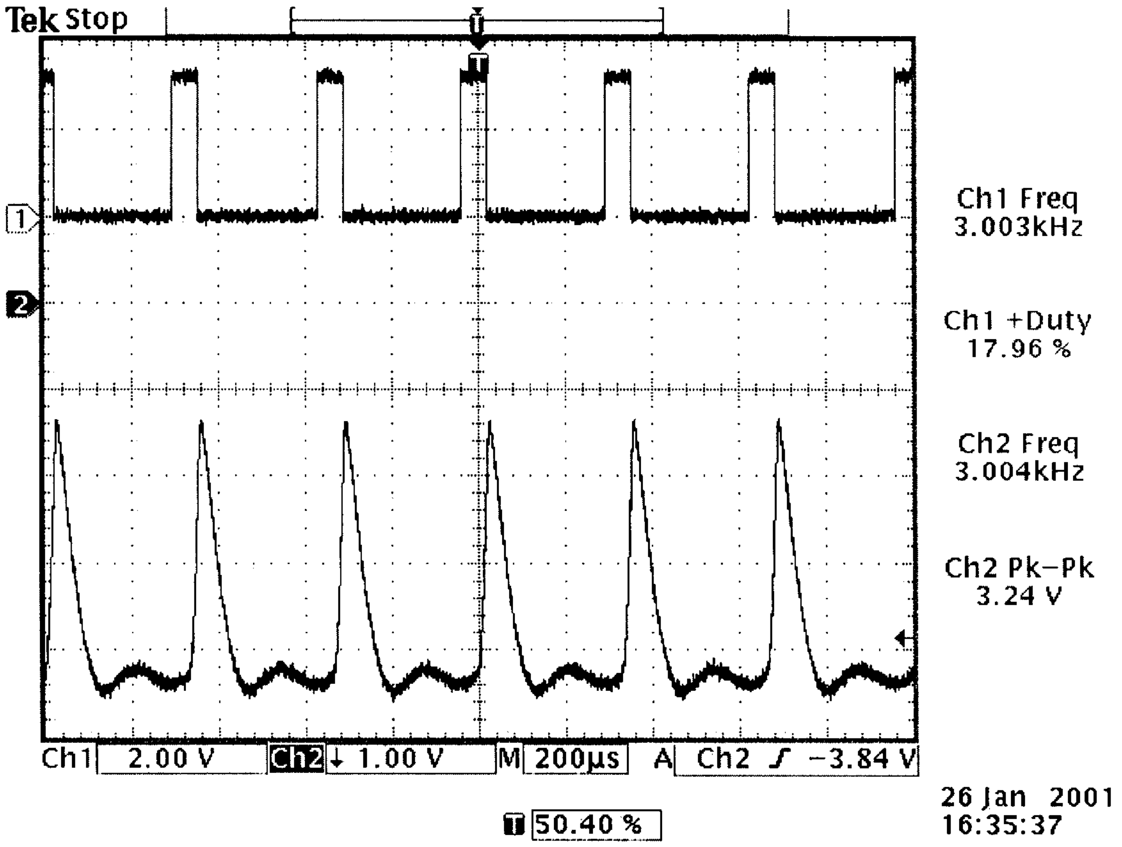
Figure 15:
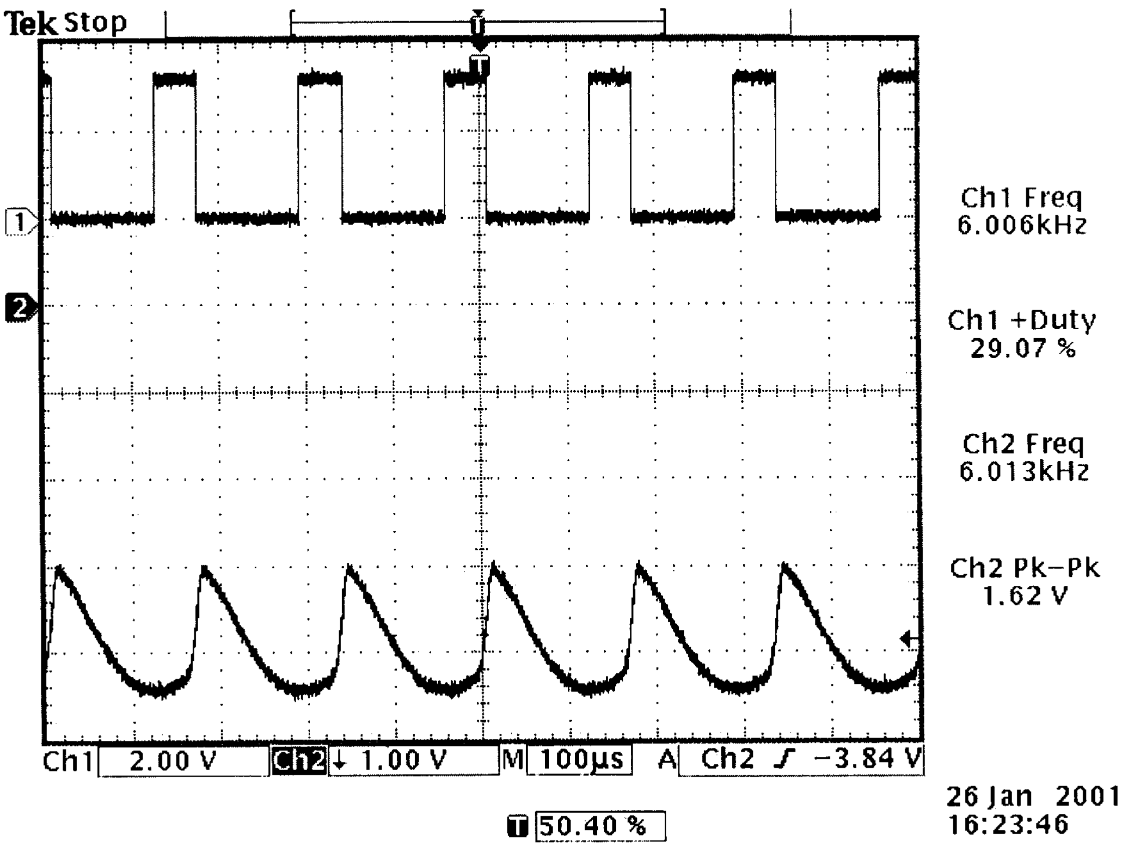
Figure 16:
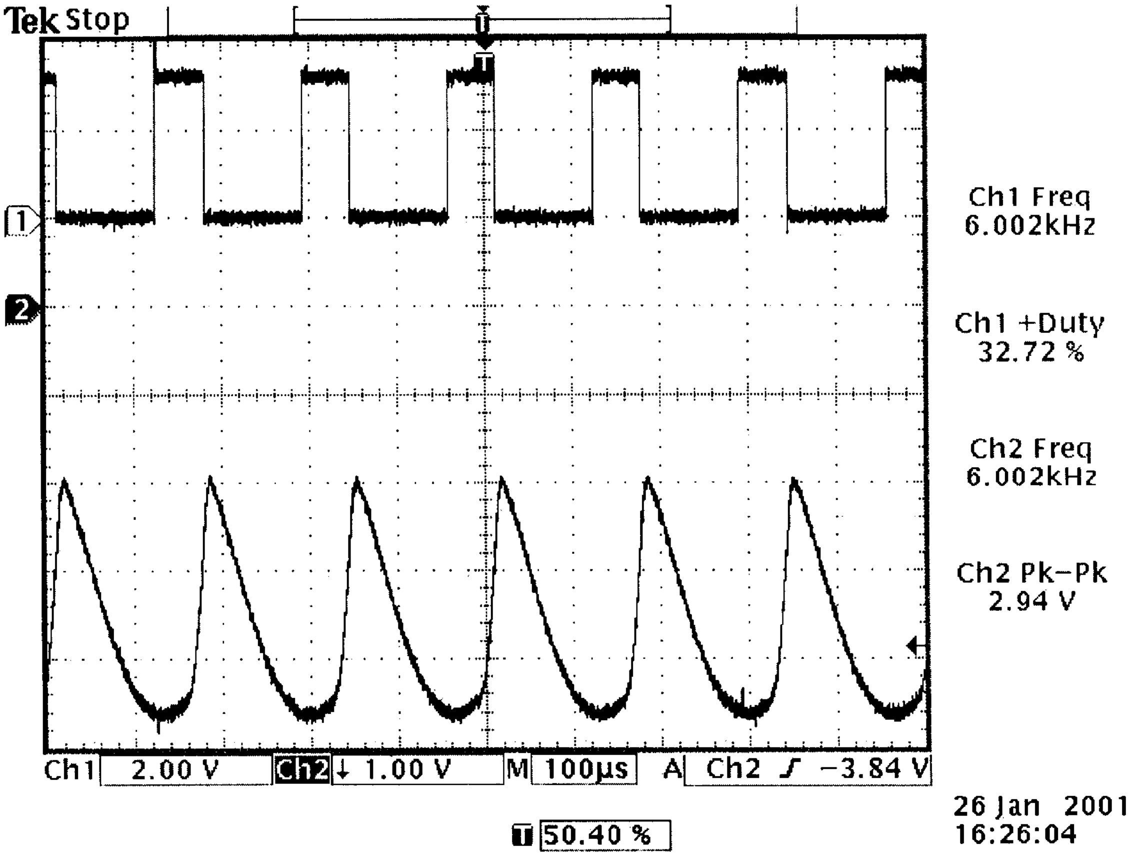
Figure 17:
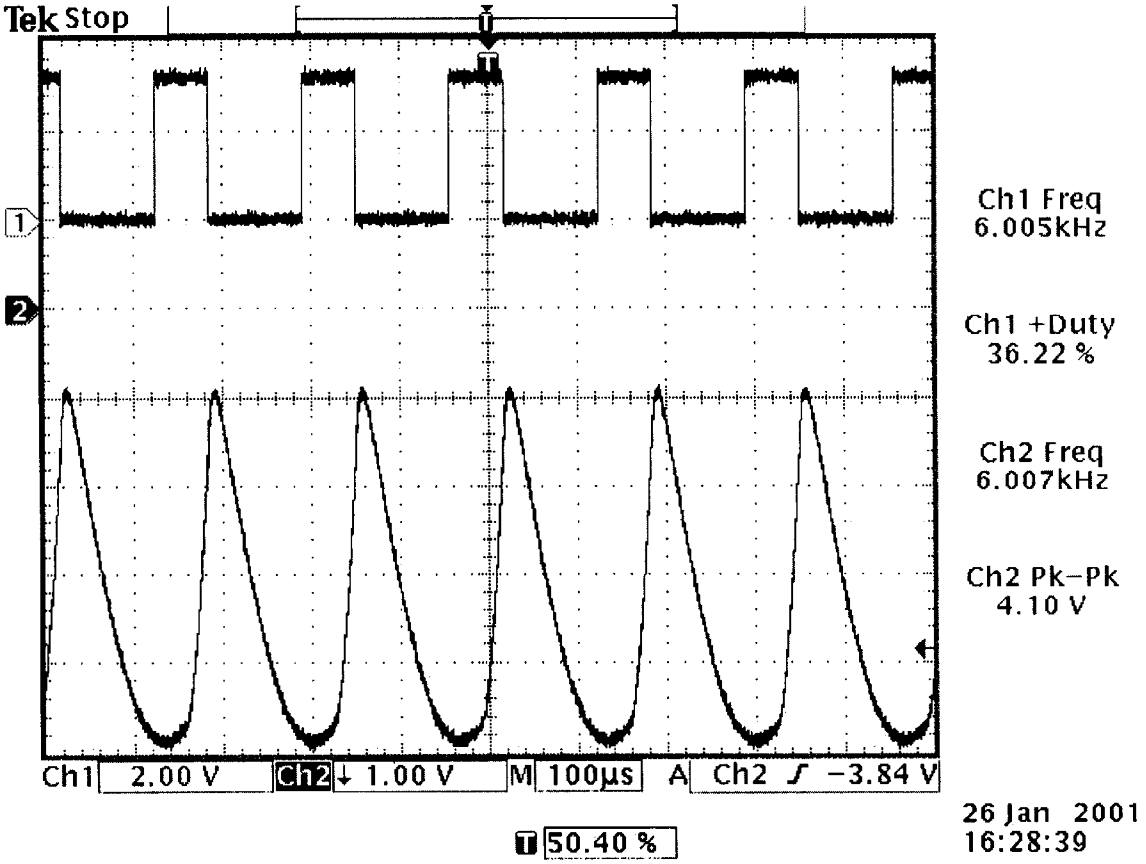

In contrast, the signal response curves depicted in FIGS. 6–11, for example, in which a diode 510 is used in a sound generation circuit 500 (see FIG. 5) to protect a field effect transistor (FET) 520 or other transistor depict signal responses that do not resemble a singular sine wave. A singular sine wave response is often desirable to produce a more pure tone quality.

In circuit 300 capacitors 360 and 370 smooth out the PWM signal. In circuit 300, a pseudo sine wave is therefore generated with a relatively low cost circuit solution and also circuitry which requires a relatively small amount of space within the handheld computer device. Using an exemplary circuit 300, as depicted in FIGS. 13–18, the resulting electrical signal received by buzzer 310 is similar to a triangle wave near the low end of the frequency range (see FIG. 13, e.g.) and substantially resembles a sine wave at the upper end of the frequency range (see FIG. 18, e.g.). Accordingly, the pseudo sine wave generated allows for the adjustment of the duty cycle, in software, of the period of the signal, which allows for volume change at speaker 310 because the amplitude of the signal reaching speaker 310 is able to be adjusted. Further, using a resultant pseudo sine wave at buzzer 310 reduces unwanted frequencies that accompany a square wave, thereby producing a more pure tone quality sound.

Accordingly, circuit 300 provides improved sound quality over other sound generation device circuits using a PWM signal and a buzzer or similar sound generators which are low cost and require relatively small spaces within the handheld computer device or other device. In a particular embodiment, circuit 300 may be used with a software pre-filter which is configured to change the volume at particular frequencies, to provide a substantially flat frequency response curve over a large frequency range. An implementation of such a software prefilter may use a look up table of frequencies versus an adjustment amount of volume to reduce and an associated software algorithm to provide such volume adjustment.

While the detailed drawings, specific examples and particular formulations given describe exemplary embodiments, they serve the purpose of illustration only. The hardware and software configurations shown and described may differ depending on the chosen performance characteristics and physical characteristics of the computing devices. For example, the type of computing device, communications bus, or processor used may differ. The systems shown and described are not limited to the precise details and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. A sound generator circuit configured for a handheld computer, comprising:

a low pass filter having an input and an output, the input being coupled to a pulse width modulated (PWM) signal line;

a switching circuit coupled to the output of the low pass filter and being controlled by the output of the low pass filter;

a sound generator having a first and a second terminal, the first terminal being coupled to a voltage source and the second terminal being coupled to the switching circuit; and a high pass filter coupled across the first and second terminals.

2. The sound generator circuit of claim 1, wherein the low pass filter includes a resistor and a capacitor.

3. The sound generator circuit of claim 1, wherein the high pass filter includes a capacitor.

4. The sound generator circuit of claim 3, wherein the high pass filter includes one (1) microfarad (μF) capacitor.

5. The sound generator circuit of claim 1, wherein the switching circuit includes a transistor.

6. The sound generator circuit of claim 5, wherein the transistor is a darlington transistor.

7. The sound generator circuit of claim 1, wherein the sound generator is a buzzer.

8. A handheld computer, comprising:

a processor;

a memory coupled to the processor; and a sound generator circuit, configured to receive a pulse width modulated (PWM) signal from the processor, the sound generator circuit including;

a low pass filter having an input and an output, the input is configured to receive the PWM signal, a switching circuit coupled to the output of the low pass filter and being controlled by the output of the low pass filter, and a sound generator having a high pass filter coupled in parallel therewith.

9. The handheld computer of claim 8, wherein the low pass filter includes a resistor and a capacitor.

10. The handheld computer of claim 8, wherein the high pass filter includes a capacitor.

11. The handheld computer of claim 10, wherein the capacitor is sized in the range of 0.1 microfarad (μF) to 10 μF.

12. The handheld computer of claim 8, wherein the switching circuit includes a transistor.

13. The handheld computer of claim 12, wherein the transistor is a darlington transistor.

14. The handheld computer of claim 8, wherein the sound generator is a buzzer.

15. A method of producing a tone with a sound generator in a handheld computer, comprising:

filtering a pulse width modulated (PWM) signal with a low pass filter to provide a slope to the edges of the PWM signal, the low pass filter having an input and output, the input receiving the PWM signal;

causing a switching circuit to open and close according to the filtered signal, switching circuit coupled to the output of the low pass filter and being controlled by the output of the low pass filter;

filtering the signal using a capacitor disposed across the terminals of a sound generator the capacitor providing high pass filter characteristics.

16. The method of claim 15, further comprising:

providing a voltage input to a terminal of the sound generator circuit.

17. The method of claim 15, wherein the low pass filter includes a resistor and a capacitor.

18. The method of claim 15, wherein the switching circuit includes a transistor.

19. The method of claim 18, wherein the transistor is a darlington transistor.

20. The method of claim 15, wherein the capacitor is a size in the range of 0.1 microfarad (μF) and 10 μF.

* * * * *